(12) United States Patent  (10) Patent No.: US 7,683,610 B2
Shimazawa  (45) Date of Patent: Mar. 23, 2010

(54) METHOD FOR INSPECTING MAGNETIC CHARACTERISTICS OF A PLURALITY OF THIN MAGNETIC HEADS BY MEANS OF LOCAL APPLICATION OF MAGNETIC FIELD

(75) Inventor: Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 137 days.

(21) Appl. No.: 12/041,532

(22) Filed: Mar. 3, 2008

(65) Prior Publication Data
US 2009/0219018 A1    Sep. 3, 2009

(51) Int. Cl.
G01R 33/12    (2006.01)
G01R 33/02    (2006.01)

(52) U.S. Cl. .................. 324/210; 324/252; 324/246

(58) Field of Classification Search .................. 324/210, 324/212, 263, 252, 246; 257/425, 422; 360/110, 360/235.7, 319, 313; 365/35
See application file for complete search history.

(56) References Cited

U.S. PATENT DOCUMENTS
7,019,371 B2    3/2006    Seigler

FOREIGN PATENT DOCUMENTS
JP    6-150264    5/1994
JP    2000-306222    11/2000
JP    2000-353309    12/2000
JP    2003-337097    11/2003

Primary Examiner—Reena Aurora
(74) Attorney, Agent, or Firm—Knobbe Martens Olson & Bear, LLP

(57) ABSTRACT

A method for inspecting magnetic characteristics of a thin film magnetic head that is arranged in a row bar includes: a step of preparing a row bar having sliders including a thin film magnetic head formed therein and lapping guides having magnetoresistance effect; a step of preparing a magnetic field applying row bar having first and second magnetic field applying elements; a first positioning step in which said magnetic field applying row bar is arranged opposite to said row bar; a second positioning step in which a relative movement between said magnetic field applying row bar and said row bar is made so that at least one of said lapping guides exhibits a largest output voltage; and a measurement step in which a relationship between the intensity of the magnetic field and an output voltage of a magnetic field sensor is obtained.

6 Claims, 8 Drawing Sheets

METHOD FOR INSPECTING MAGNETIC CHARACTERISTICS OF A PLURALITY OF THIN MAGNETIC HEADS BY MEANS OF LOCAL APPLICATION OF MAGNETIC FIELD

BACKGROUND OF THE INVENTION

1. Field of the Invention

The present invention relates to a method for inspecting magnetic characteristics of thin film magnetic heads, more particularly, to a method for inspecting thin film magnetic heads arranged in a row bar.

2. Description of the Related Art

Conventionally, thin film magnetic heads are manufactured by the following steps. First, a stack that includes a magnetic field sensor (a read head portion) and a write head portion is formed on a substrate in the wafer process. Next, the wafer is diced and separated into row bars. A plurality of sliders is disposed in each row bar along the longitudinal direction thereof, and each slider is provided with a thin film magnetic head that is formed in the wafer process. A row bar serves as a work unit in a lapping step for forming an air bearing surface. When lapping is completed, the row bar is separated into individual sliders, each of which is then assembled into a head gimbal assembly and mounted on a hard disk drive in the final process.

The thin film magnetic head, prior to being finished as a slider and being sent to a subsequent process, undergoes an inspection of magnetic characteristics and other tests. Conventionally, sliders are separately attached to a dedicated inspection apparatus, called the spin stand, and inspected one by one. This method enables sliders to be inspected in the same environment as in a state in which the sliders are actually mounted on hard disk drives, but is disadvantageous as regards the efficiency of the inspection. Accordingly, there has been proposed a method for collectively inspecting sliders that are mass-produced.

Japanese Patent Laid-Open Publication No. 150264/94 discloses an inspection method called quasi-static test (QST). The test, which is performed prior to the final assembling of hard disk drives, simulates an actual environment. Specifically, an alternating magnetic field (refers to an alternately changing magnetic field) that is generated by a magnetic field generator is applied from the outside, instead of a magnetic field emitted from a recording medium, in order to collectively measure and evaluate various magnetic characteristics of a plurality of sliders arranged in a row bar. A Helmholtz coil is used as the magnetic field generator. Application of high-frequency alternating current to the Helmholtz coil causes the Helmholtz coil to generate an alternating magnetic field. The row bar is placed in front of the Helmholtz coil so that an alternating magnetic field is applied to magnetic field sensors. The alternating magnetic field simulates a varying magnetic field, which corresponds to signal "0" and "1", that the magnetic field sensors receive from a rotating magnetic disk in an actual environment. A sense current is generated to flow in the magnetic field sensors by means of probes. In accordance with a change in the magnetic field, the output voltage of the magnetic field sensor changes due to magnetoresistance effect. In this way, the relationship between the external magnetic field and the signal output (output voltage) can be obtained. The data that are obtained are used to evaluate the magnetic characteristics of the magnetic field sensors and to prevent defective sliders from being sent to a subsequent process.

In recent years, ultra-high recording density of hard disk drives has been promoted. The ultra-high recording density essentially requires ultra-high linear recording density. The ultra-high linear recording density means an increase in the frequency of an alternating magnetic field that is applied to a thin film magnetic head. Accordingly, it is preferable that thin film magnetic heads that realize the ultra-high linear recording density be inspected under the environment of an alternating magnetic field having an ultra-high frequency. However, in a conventional Helmholtz coil, there is a limitation to an increase in the frequency of an alternating magnetic field because of the characteristics of the device. Frequencies in the order of several hundred kilohertz are within the capability of the Helmholtz coil, but frequencies higher than 1 megahertz are difficult to achieve. However, alternating magnetic fields in the order of several megahertz are found in the actual environment of hard disk drives. Thus, it has already been difficult to completely simulate the actual environment by a conventional QST. Use of a spin stand may realize such high frequencies, but will lead to inefficiency in the inspection.

SUMMARY OF THE INVENTION

An object of the present invention is to provide a method for inspecting magnetic characteristics of thin film magnetic heads in an efficient manner, the method being capable of sufficiently simulating a high-frequency alternating magnetic field. Another object of the present invention is to provide a magnetic field applying bar which can be suitably used in the method for inspecting the magnetic characteristics of thin film magnetic heads.

According to an embodiment of the present invention, a method for inspecting magnetic characteristics of a thin film magnetic head that is arranged in a row bar comprises: a step of preparing a row bar having a plurality of sliders which are arranged along a longitudinal direction of said row bar, each slider including a thin film magnetic head formed therein, wherein said row bar is provided with lapping guides having magnetoresistance effect, said lapping guides being located at least two positions which are selected from positions between the sliders adjacent to each other and positions at both ends of said row bar; a step of preparing a magnetic field applying row bar having first magnetic field applying elements, each of which corresponds to each thin film magnetic head, and having at least two second magnetic field applying elements, each of which corresponds to each of the at least two lapping guides; a first positioning step in which said magnetic field applying row bar is arranged opposite to said row bar such that a magnetic pole end of each first magnetic field applying element faces a magnetic field sensor of the corresponding thin film magnetic head and such that a magnetic pole end of each second magnetic field applying element faces the corresponding lapping guide; a second positioning step in which a magnetic field is applied from said second magnetic field applying elements to said lapping guides while an electric current is applied to said lapping guide, and in which a relative movement between said magnetic field applying row bar and said row bar is made so that at least one of said lapping guides exhibits a largest output voltage, said second positioning step being carried out after said first positioning step; and a measurement step in which an alternating magnetic field is applied, from said first magnetic field applying element to said magnetic field sensor of said thin film magnetic head, while an electric current is applied to said magnetic field sensor, and while intensity of the magnetic field is changed, and in which a relationship between the intensity of the magnetic field and an output voltage of the magnetic field sensor is obtained, said measurement step being carried out after said second positioning step.

According to the inspection method described above, the magnetic pole end of each first magnetic field applying element is disposed opposite to the magnetic field sensor of the thin film magnetic head, and a magnetic field is individually applied to the magnetic field sensor of the thin film magnetic head from the corresponding first magnetic field applying element. In other words, each first magnetic field applying element only needs to apply a predetermined magnetic field to the magnetic field sensor of the corresponding thin film magnetic head. In addition, the required intensity of the generated magnetic field can be sufficiently small because the magnetic field applying bar is arranged opposite to a row bar. This facilitates generation of a significantly high frequency alternating magnetic field and makes it possible to more precisely simulate an alternating magnetic field that is generated in an actual environment in hard disk drives, as compared with a case in which a large-sized conventional Helmholtz coil is used.

Further, this inspection method includes two kinds of positioning steps. The first positioning step is a positioning step for arranging the magnetic field applying bar opposite to the row bar with, so to speak, mechanically achievable accuracy. The first positioning step enables a rough adjustment of the positional relationship between the first magnetic field applying element and the magnetic field sensor of the corresponding thin film magnetic head. The second positioning step, which makes use of a lapping guide, provides a more precise positioning step that utilizes magnetic properties. The lapping guide used herein refers to an element that is particularly provided in order to form the element height of a magnetic field sensor into a predetermined range in the lapping process. The lapping guide, whose element height decreases as lapping progresses and whose electrical resistance increases, is used in order to control the lapping amount while monitoring the electrical resistance thereof by using the above characteristics. In the present embodiment, the lapping guide is formed of a material having the magnetoresistance effect. Hence, when a magnetic field is applied from the second magnetic field applying element to the lapping guide and a relative movement is made between the magnetic field applying bar and the row bar, the intensity of the magnetic field that the lapping guide receives changes due to the magnetoresistance effect, and thereby a variation in the output voltage of the lapping guide is caused. By adjusting the relative positional relationship between the magnetic field applying bar and the row bar such that the output voltage is maximized, the lapping guide comes to a position that is substantially opposite to the second magnetic field applying element. As a result, the first magnetic field applying elements also come to positions that are substantially opposite to the magnetic field sensors of the thin film magnetic heads.

The reason that importance is placed on the positioning of the first magnetic field applying element and the magnetic field sensor of the thin film magnetic head, as described above, is because the magnetic field sensor has a significantly small dimension in the track width direction thereof. Thin film magnetic heads today have a width in the order of several tens of nanometers in the track width direction, and therefore, common mechanical methods are hardly applicable for the positioning of the first magnetic field applying element and the magnetic field sensor of the thin film magnetic head. This is a problem that does not occur when a Helmholtz coil is used to collectively apply a magnetic field. However, the inspection method of the present embodiment is capable of meeting such a requirement without difficulty.

According to another embodiment of the present invention, the method for inspecting magnetic characteristics of a thin film magnetic head that is arranged in a row bar further comprises a third positioning step in which a magnetic field is applied from said first magnetic field applying element to said magnetic field sensor of said thin film magnetic head, while an electric current is applied to said magnetic field sensor, and in which a relative movement between said magnetic field applying row bar and said row bar is made so that said magnetic field sensor exhibits a largest output voltage, said third positioning step being carried out after said second positioning step and prior to said measurement step. In general, a magnetic field sensor has a significantly smaller dimension than a lapping guide. Accordingly, by using the magnetic field sensor and the first magnetic field applying element in order to perform a process similar to the second positioning step, the first magnetic field applying elements can be positioned more precisely at positions that are substantially opposite to the magnetic field sensors of the thin film magnetic heads.

According to yet another embodiment of the present invention, a magnetic field applying row bar is used to inspect magnetic characteristics of a thin film magnetic head that is arranged in a row bar, wherein said row bar has a plurality of sliders which are arranged along a longitudinal direction of said row bar, each slider including a thin film magnetic head formed therein, wherein said row bar is provided with lapping guides having magnetoresistance effect, said lapping guides being located at least two positions which are selected from positions between the sliders adjacent to each other and positions at both ends of said row bar. The magnetic field applying row bar comprises: a plurality of first magnetic field applying elements that are located such that a magnetic pole end of each first magnetic field applying element faces a magnetic field sensor of said thin film magnetic head when said magnetic field applying row bar is arranged opposite to said row bar; and at least two second magnetic field applying elements that are located such that magnetic pole ends thereof face at least two of said lapping guides when said magnetic field applying row bar is arranged opposite to said row bar. The first magnetic field applying element is capable of applying an alternating magnetic field to said magnetic field sensor that is opposite thereto while varying intensity of the magnetic field, and said second magnetic field applying element is capable of applying a magnetic field to said lapping guide that is opposite thereto.

The above and other objects, features and advantages of the present invention will become apparent from the following description with reference to the accompanying drawings which illustrate examples of the present invention.

DETAILED DESCRIPTION OF THE PREFERRED EMBODIMENTS

First, a description will be made of a general outline of a thin film magnetic head to which the present invention is applied. The present invention is applicable to a thin film magnetic head that is provided with any element that utilizes the magnetoresistance effect. Examples of these elements include a CIP (Current in Plane)-GMR element in which a sense current flows in parallel with the film plane thereof, a CPP (Current Perpendicular to the Plane)-GMR element and a TMR (Tunnel Magneto-resistance) element in both of which a sense current flows perpendicularly to the film plane thereof. An example of a thin film magnetic head that is particularly suitable for the present invention will be described. In the magnetoresistance effect element of a thin film magnetic head, the function of a magnetic field sensor is achieved by a pair of magnetic layers, which are stacked in the vertical direction and whose magnetization directions change according to an external magnetic field, and an intermediate layer that is interposed between the pair of magnetic layers, as will be described later.

Figure 1:
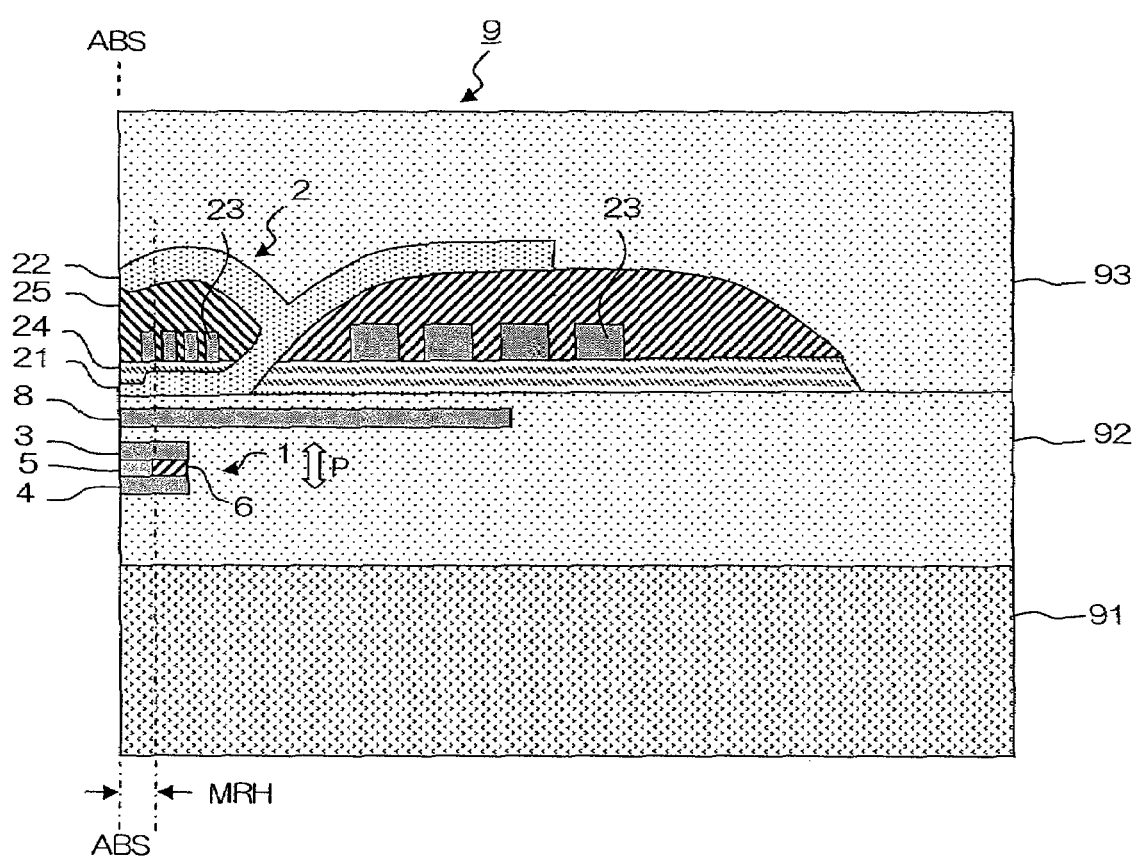
FIG. 1 is a conceptual cross-sectional view of a thin film magnetic head that is applicable to a method for inspecting the magnetic characteristics of the thin film magnetic head in accordance with an embodiment of the present invention.
Figure 2:
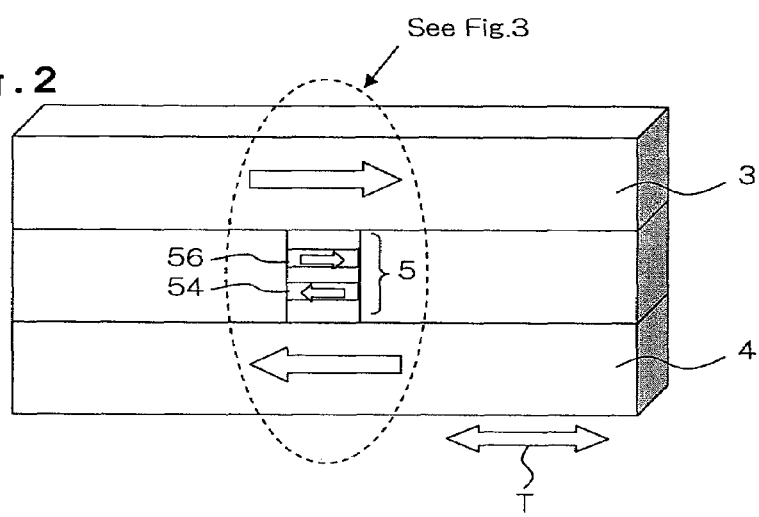
FIG. 2 is a perspective view of the essential part of the magnetoresistance effect element of the thin film magnetic head shown in FIG. 1, showing the air bearing surface thereof.
Figure 3:
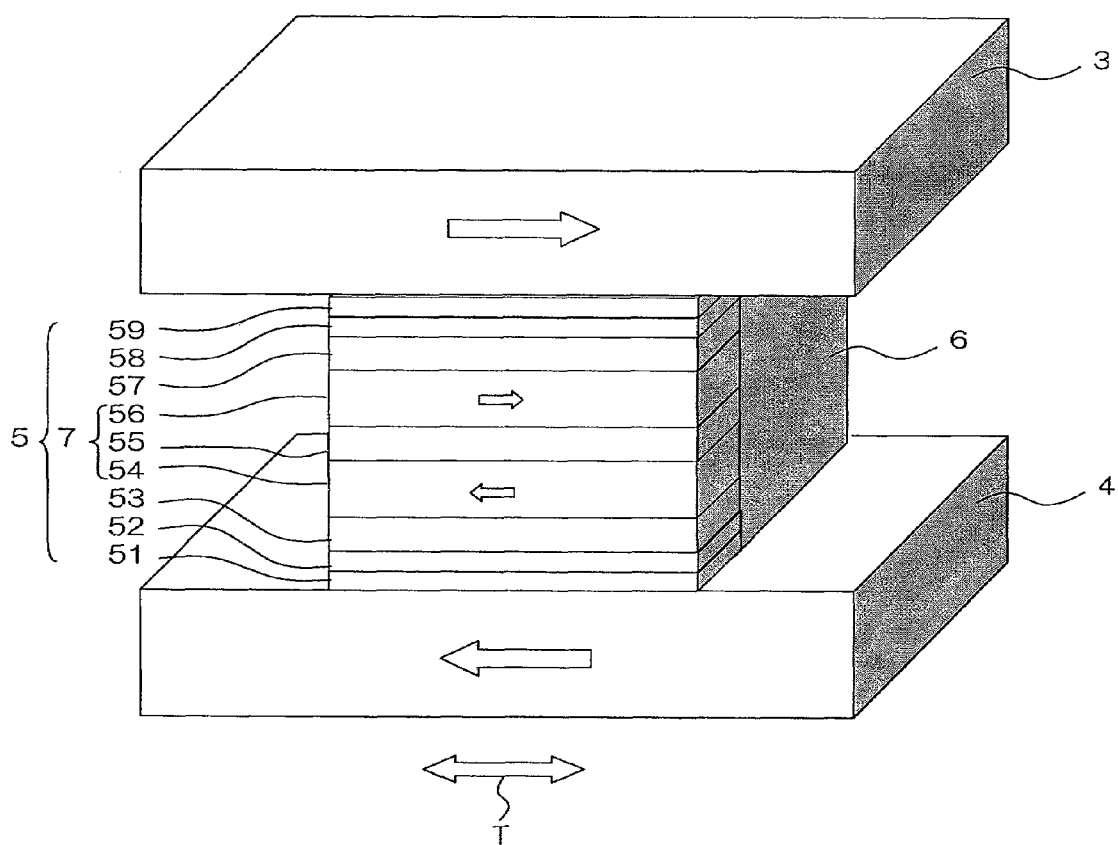
FIG. 3 is a partially enlarged perspective view of FIG. 2.

FIG. 1 is a cross-sectional view of the essential part of a thin film magnetic head described above. FIG. 2 is a perspective view illustrating the essential part of the magnetoresistance effect element of the thin film magnetic head in FIG. 1, showing the air bearing surface thereof. FIG. 3 is a partially enlarged perspective view of FIG. 2. The air bearing surface refers to a surface of the thin film magnetic head that faces a recording medium.

Thin film magnetic head 9 includes magnetoresistance effect element (magnetic field detecting element) 1 and write head portion 2, both of which are formed on substrate 91. Magnetoresistance effect element 1 includes magneto-resistive (MR) stack 5 having many stacked layers, upper shield electrode layer 3 and lower shield electrode layer 4. Upper shield electrode layer 3 and lower shield electrode layer 4 are provided to sandwich MR stack 5 in direction P that is perpendicular to the film plane (stacking direction). The leading end of MR stack 5 is arranged exposed on air bearing surface ABS. MR stack 5 is configured to allow a sense current to flow in direction P that is perpendicular to the film plane under a voltage that is applied between upper shield electrode layer 3 and lower shield electrode layer 4. The magnetic field of a recording medium, not illustrated, at a position that is opposite to MR stack 5 changes with rotation of the recording medium. The change in the magnetic field is detected as a change in electrical resistance that is caused by the magnetoresistance effect. Magnetoresistance effect element 1 uses this principle to read magnetic information written in the recording medium. Bias magnetic layer 6 for applying a bias magnetic field to MR stack 5 is provided on the back side of MR stack 5, as viewed from the air bearing surface. Table 1 shows the film configuration of the essential part of magnetoresistance effect element 1.

TABLE 1

| Layer Configuration | Composition | Thickness (nm) | | |
|---|---|---|---|---|
| Upper shield electrode layer 3 | NiFe | 5.0 | | |
| Exchange coupling transfer layer 59 | Ru | 0.8 | | |
| Gap adjustment layer 58 | CoFe | 1.0 | | |
| Exchange coupling adjustment layer 57 | Cu | 0.9 | | |
| Second magnetic layer 56 | CoFe | 4.0 | | |
| Intermediate layer 55 | ZnO or MgO | 1.2(ZnO) 0.5(MgO) | Magnetic field sensor 7 | MR stack 5 |
| First magnetic layer 54 | CoFe | 4.0 | | |
| Exchange coupling adjustment layer 53 | Cu | 0.9 | | |
| Gap adjustment layer 52 | CoFe | 1.0 | | |
| Exchange coupling transfer layer 51 | Ru | 0.8 | | |
| Lower shield electrode layer 4 | NiFe | 5.0 | | |

Referring to FIGS. 2 and 3, MR stack 5 includes a pair of upper and lower magnetic layers (first magnetic layer 54 provided on the lower side of the stack and second magnetic layer 56 provided on the upper side of the stack) whose magnetization directions change according to an external magnetic field. Intermediate layer 55, which is made of ZnO or MgO, is provided between first and second magnetic layers 54, 56. Exchange coupling transfer layer 51, gap adjustment layer 52, and exchange coupling adjustment layer 53 are provided between first magnetic layer 54 and lower shield electrode layer 4. Similarly, exchange coupling adjustment layer 57, gap adjustment layer 58, and exchange coupling transfer layer 59 are provided between second magnetic layer 56 and upper shield electrode layer 3. Each of exchange coupling transfer layers 51, 59 is made of a ruthenium (Ru) layer having a thickness of approximately 0.8 nm. Each of gap adjustment layers 52, 58 is made of a CoFe layer having a thickness of approximately 1 nm. Each of exchange coupling adjustment layers 53, 57 is made of a copper (Cu) layer having a thickness of 0.9 nm.

Upper shield electrode layer 3 and lower shield electrode layer 4 are magnetized in directions that are anti-parallel to each other. The term "anti-parallel" means that the directions of magnetization are parallel with each other but opposite to each other. Various methods can be applied to fix the magnetization directions of upper shield electrode layer 3 and lower shield electrode layer 4 in anti-parallel directions. In the present embodiment, upper shield electrode layer 3 and lower shield electrode layer 4 are formed into elongated shapes that extend along track width direction T, as illustrated in FIG. 2. Both layers are magnetized in a single magnetic domain due to the shape anisotropy effect, and are magnetized in directions that are anti-parallel to each other. Alternatively, antiferromagnetic layers may be provided adjacent to upper shield electrode layer 3 and lower shield electrode layer 4, respectively, to fix the magnetization directions thereof by using antiferromagnetic coupling.

First magnetic layer 54 forms a positive exchange coupling with upper shield electrode layer 3 via first exchange coupling transfer layer 51, first gap adjustment layer 52, and first exchange coupling adjustment layer 53. As a result, first magnetic layer 54 is subjected to a force that magnetizes first magnetic layer 54 in the same direction as lower shield electrode layer 4, as shown by the arrows in FIGS. 2 and 3. Similarly, second magnetic layer 56 forms a positive exchange coupling with upper shield electrode layer 3 via second exchange coupling transfer layer 59, second gap adjustment layer 58, and second exchange coupling adjustment layer 57. As a result, second magnetic layer 56 is subjected to a force that magnetizes second magnetic layer 56 in the same direction as upper shield electrode layer 3, as shown by the arrows in FIGS. 2 and 3.

Figure 4:
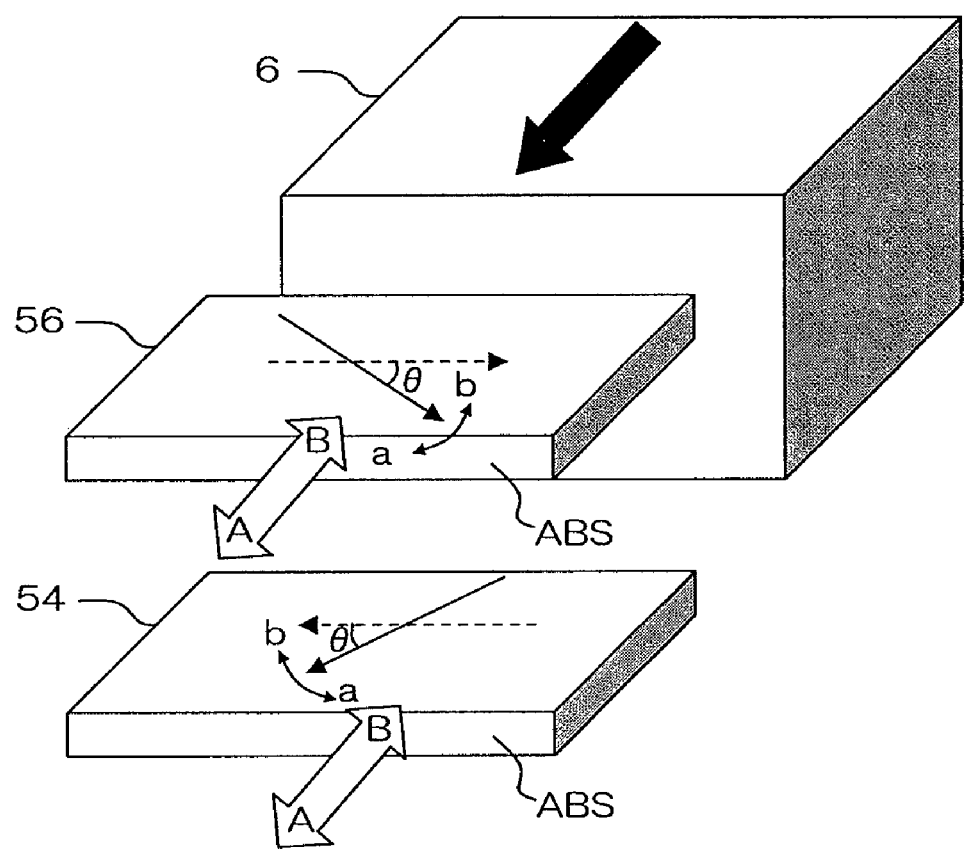
FIG. 4 is a schematic view illustrating the magnetization of the first and second magnetic layers.

FIG. 4 is a schematic view illustrating the magnetization of the first and second magnetic layers. As described above, bias magnetic layer 6 is provided on the back side of MR stack 5, as viewed from air bearing surface ABS. Bias magnetic layer 6 is magnetized in the direction that is perpendicular to air bearing surface ABS, as shown by the solid black arrow in the figure. As a result, first and second magnetic layers 54, 56 are subjected to a magnetic field that is perpendicular to air bearing surface ABS. Thus, first and second magnetic layers 54, 56 not only form an exchange coupling with upper shield electrode layer 3 and lower shield electrode layer 4, respectively, but also receive a bias magnetic field from bias magnetic layer 6. As a result, the magnetization directions of first and second magnetic layers 54, 56, which are represented by the arrows in dotted lines, are rotated in opposite directions by predetermined angle θ, as shown by the arrows in solid lines in FIG. 4, and ideally form right angles.

If an external magnetic field is applied under this state, as shown by the white bold arrows in the figure, then the magnetization directions of first and second magnetic layers 54, 56 are rotated in opposite directions depending on the direction of the external magnetic field. Specifically, the external magnetic field that is applied in direction A in the figure will rotate the magnetization directions of first and second magnetic layers 54, 56 in direction "a" in the figure. The external magnetic field that is applied in direction B in the figure will rotate the magnetization directions of first and second magnetic layers 54, 56 in direction "b" in the figure. This causes a change in the angle formed between the magnetization directions of first and second magnetic layers 54, 56 depending on the external magnetic field, and thereby causes a change in the resistance of a sense current based on the magnetoresistance effect. The direction and intensity of the external magnetic field can thus be detected by magnetoresistance effect element 1.

In this way, the pair of magnetic layers 54, 56 whose magnetization directions change according to an external magnetic field and intermediate layer 55 that is interposed therebetween function as magnetic field sensor 7 in magnetoresistance effect element 1 of the present embodiment. Magnetoresistance effect element 1 having intermediate layer 55 that is made of a metal or made of a semiconductor, such as ZnO, functions as a CPP-GMR element, whereas magnetoresistance effect element 1 having intermediate layer 55 that is made of an insulator, such as MgO, functions as a TMR element.

Referring again to FIG. 1, write head portion 2 is provided above magnetic field detecting element 1 via inter-element shield layer 8 that is formed by means of sputtering or the like. Write head portion 2 has an arrangement for so-called perpendicular magnetic recording. Magnetic pole layers for writing have main magnetic pole layer 21 and auxiliary magnetic pole layer 22. These magnetic pole layers 21, 22 are formed by frame plating or the like. Main magnetic pole layer 21, which is made of FeCo, is exposed on air bearing surface ABS substantially perpendicularly thereto. Coil layer 23, which extends above gap layer 24 made of an insulating material, is wound around main magnetic pole layer 21 in order to induce a magnetic flux within main magnetic pole layer 21. Coil layer 23 is formed by means of frame plating or the like. The magnetic flux is guided inside main magnetic pole layer 21 and is emitted from air bearing surface ABS toward the recording medium. Main magnetic pole layer 21 is reduced in dimension not only in direction P that is perpendicular to the film plane but also in track width direction T (i.e., the direction that is perpendicular to the drawing of FIG. 1) in the vicinity of air bearing surface ABS, thereby producing a concentrated and intense writing magnetic field that realizes high recording density.

Auxiliary magnetic pole layer 22 is a magnetic layer that is magnetically coupled to main magnetic pole layer 21. Auxiliary magnetic pole layer 22 is a magnetic pole layer which has a thickness of about 0.01 to about 0.5 μm and which is made of an alloy that consists of at least two of Ni, Fe and Co. Auxiliary magnetic pole layer 22 is branched from main magnetic pole layer 21 and is provided opposite to main magnetic pole layer 21 via gap layer 24 and coil insulating layer 25 at air bearing surface ABS. Auxiliary magnetic pole layer 22 has a trailing shield portion having a wider layer section than the rest of auxiliary magnetic pole layer 22 at the end portion that is on the side of air bearing surface ABS. Auxiliary magnetic pole layer 22 having such an arrangement provides a steeper magnetic field gradient between auxiliary magnetic pole layer 22 and main magnetic pole layer 21 in the vicinity of air bearing surface ABS. As a result, it is possible to reduce signal output jitter, thereby to lower the error rate in reading.

Insulating layers 92, 93 are formed in the portion in which magnetoresistance effect element 1 and write head portion 2 described above are not provided.

Figure 5:
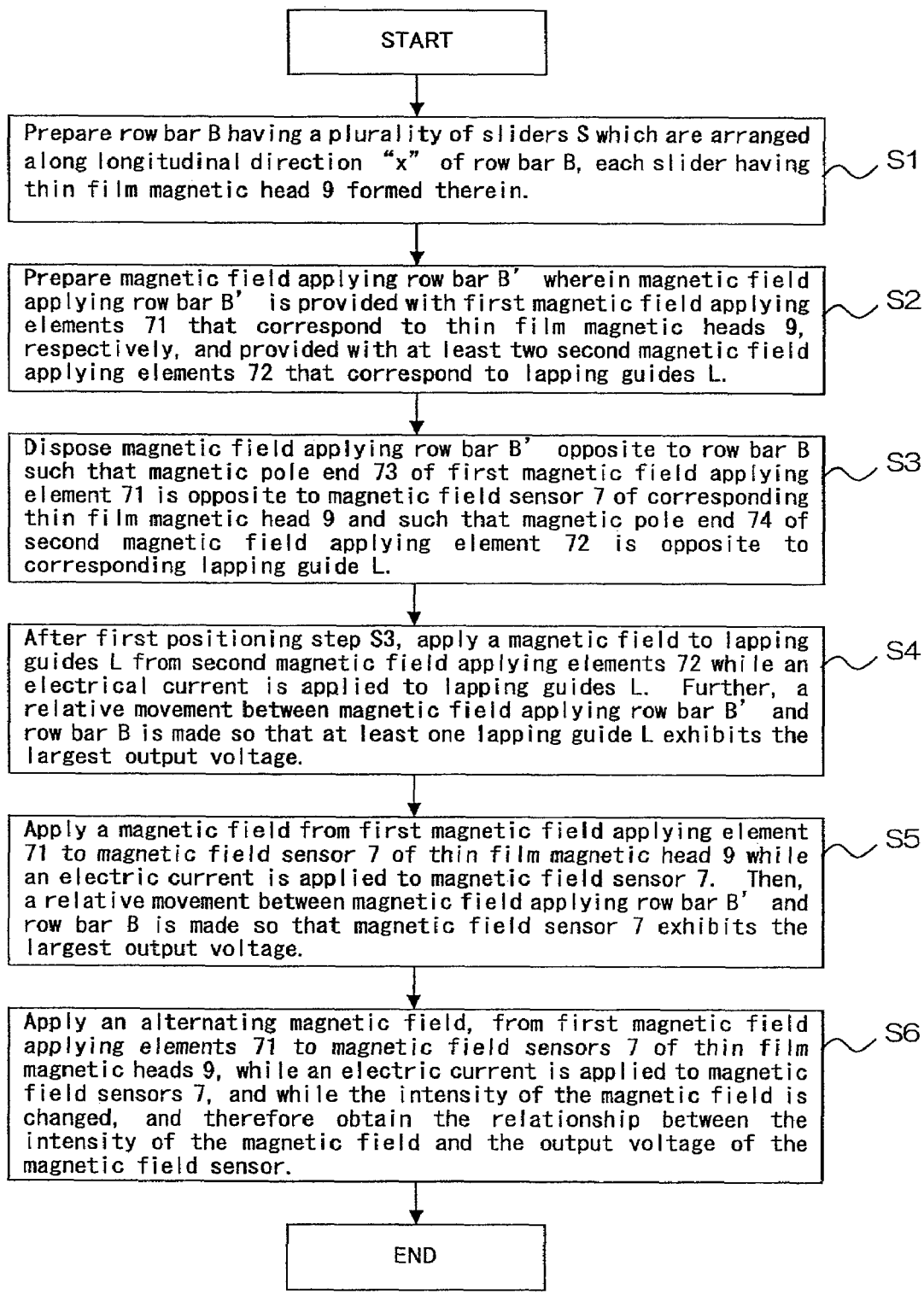
FIG. 5 is a flowchart of inspection of the magnetic characteristics of the thin film magnetic head in accordance with an embodiment of the present invention.

Next, an explanation will be made of a method for inspecting the magnetic characteristics of the above-described thin film magnetic heads arranged in a row bar, with reference to the flowchart of FIG. 5. It should be noted that the inspecting method described hereinafter is carried out as part of the manufacturing process of the thin film magnetic head.

Figure 6:
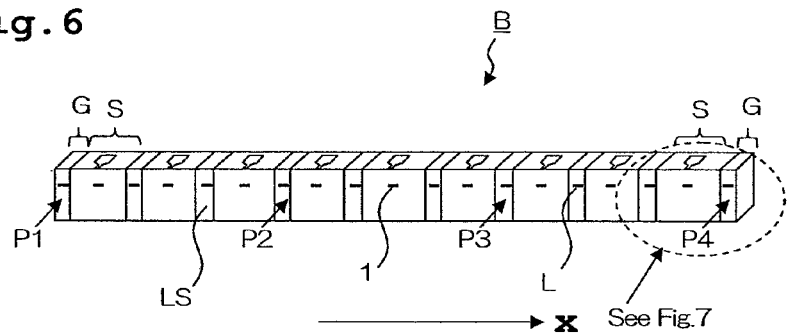
FIG. 6 is a perspective view of a row bar having many sliders formed therein.
Figure 7:
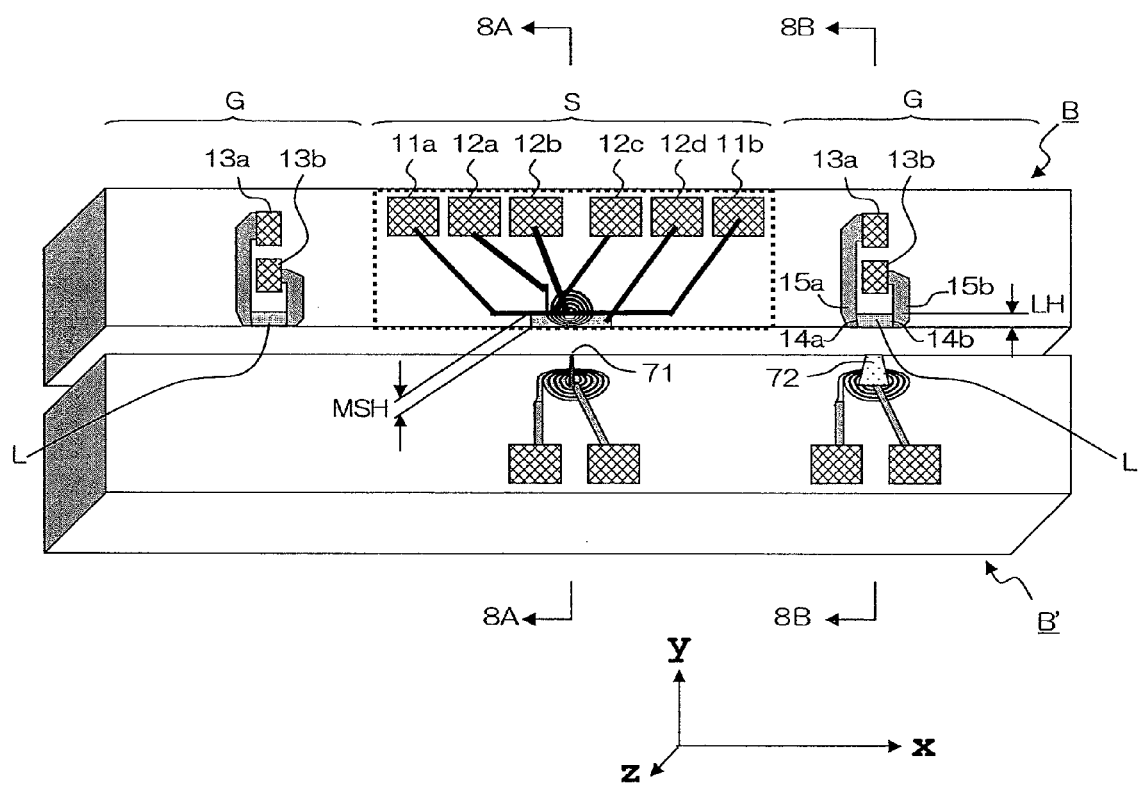
FIG. 7 is a conceptual view of a row bar showing the top surface thereof with regard to the direction of stacking, the row bar being disposed opposite to a magnetic field applying row bar.

(Step S1) First, row bar B having a plurality of sliders S is prepared. Sliders S, each having thin film magnetic head 9 formed therein, are arranged along longitudinal direction "x" of row bar B. Row bar B is fabricated by dicing a wafer to separate a part of many sliders formed on the wafer. FIG. 6 is a perspective view of a row bar having many sliders formed therein. FIG. 7 is a conceptual view of a row bar showing the top surface thereof with regard to the direction of stacking, the row bar being disposed opposite to a magnetic field applying row bar, which will be described later. It should be noted that only pads are actually provided on the top surface of the row bar in the figure. The other elements and coils are actually provided inside the row bar, although they are depicted on the top surface of the row bar for illustrative purpose. Each slider S has magnetoresistance effect element 1 of thin film magnetic head 9 formed therein. Magnetoresistance effect element 1 is formed such that it will appear on the cutting plane when a wafer is diced. By lapping the cutting plane, which is lapping surface LS, magnetoresistance effect element 1 having a predetermined element height MRH is formed (see FIG. 1). For simplicity of illustration, only twelve sliders S are provided in row bar B. However, sliders S may be provided in any numbers, and 50 to 100 sliders may often be provided in an actual bar. Referring to FIG. 7, pads 11a, 11b and pads 12a, 12b are provided on the top surface of slider S with regard to the stacking direction. Pads 11a, 11b are connected to magnetoresistance effect element 1 and apply a sense current thereto. Pads 12a, 12b are connected to write head portion 2 and apply a current to coil 24. Adjacent to pads 12a, 12b, pads 12c, 12d are provided for a heater coil that locally heats the inside of slider S. By providing heat via pads 12c, 12d, magnetoresistance effect element (magnetic field detecting element) 1 and write head portion 2 protrude by approximately several nanometers on air bearing surface ABS, causing a reduction in the magnetic space between magnetoresistance effect element (magnetic field detecting element) 1 and a recording medium, as well as between write head portion 2 and a recording medium.

Inter-element gaps G are provided between sliders S that are aligned in a line. Inter-element gaps G also serve as dicing margins when row bar B is separated into sliders S. In inter-element gap G, lapping guide L is provided on lapping surface LS. In the illustrated row bar B, lapping guides L are provided between each pair of adjacent sliders S in row bar B and at both ends of row bar B. However, lapping guides L may be provided at least two locations selected from locations between adjacent sliders S and locations at ends of row bar B.

Lapping guide L, which is generally referred to as an RLG (Resistance Lapping Guide) element or as an ELG (Electric Lapping Guide) element, has the film configuration of a CIP element in which a sense current flows in parallel with the film plane. Lapping guide L may have the same film configuration as MR stack 5, but is adapted to be supplied with a sense current, not from upper and lower shield layers, but from a pair of lead electrode films 15a, 15b that are provided on both sides of MR stack 5 with regard to the track width direction thereof. Lapping guide L exhibits a magnetoresistance effect, and is fabricated almost simultaneously with MR stack 5 in the wafer process. Both ends 14a, 14b of lapping guide L are electrically connected to pads 13a, 13b that are provided on the top surface of inter-element gap G with regard to the stacking direction, and a voltage between both ends 14a, 14b of lapping guide L can be detected by means of probes that are placed on pads 13a, 13b. In a lapping step performed prior to this step, lapping surface LS is lapped while a current is applied to lapping guide L. Lapping guide L is lapped together with MR stack 5, and consequently, element height LH (see FIG. 7) of lapping guide L decreases and the electrical resistance thereof increases. MR stack 5 having predetermined element height MRH (see FIG. 7) can be fabricated by using a relationship between the electrical resistance of lapping guide L and the lapping amount of lapping guide L that is obtained in advance. Lapping guide L does not require a significantly small element size because the fundamental function thereof is to detect a change in electrical resistance at the time of lapping. Lapping guide L typically has a width of several micrometers in the longitudinal direction "x" thereof.

(Step S2) Next, magnetic field applying row bar B' is prepared. Magnetic field applying row bar B' is provided with first magnetic field applying elements 71 that correspond to thin film magnetic heads 9, respectively, and at least two second magnetic field applying elements 72 that correspond to lapping guides L. As will be described later, the locations of first magnetic field applying elements 71 and second magnetic field applying elements 72 are set such that first magnetic field applying elements 71 face magnetic field sensors 7 of thin film magnetic head 9, respectively, and second magnetic field applying elements 72 face lapping guides L, respectively, when magnetic field applying row bar B' is disposed opposite to row bar B. First magnetic field applying elements 71 are provided in as many numbers as sliders S. Magnetic field applying row bar B' is fabricated in the wafer process, as with row bar B, and this enables highly precise positioning of first magnetic field applying elements 71 and second magnetic field applying elements 72. Further, magnetic field applying row bar B' has a surface that is lapped in the same way as row bar B and that is arranged opposite to row bar B.

Second magnetic field applying elements 72 do not have to be provided opposite to all lapping guides L. However, magnetic field applying row bar B' requires precise positioning relative to row bar B in the longitudinal direction "x" thereof, as well as in direction "y" that is perpendicular to the longitudinal direction "x". For this reason, the relative positional relationship between row bar B and magnetic field applying row bar B' should be monitored at least two locations. To this end, second magnetic field applying elements 72 are preferably provided at least both ends of magnetic field applying row bar B' so that they face lapping guides L at both ends of row bar B. However, second magnetic field applying elements 72 may be provided such that they face lapping guides L at locations between sliders S, as long as the aforementioned objective can be achieved. Furthermore, three or more second magnetic field applying elements 72 may be provided in order to enhance accuracy in positioning. For example, second magnetic field applying elements 72 may be provided at four locations in total (shown as P1 to P4 in FIG. 6), i.e., two intermediate locations obtained by trisecting magnetic field applying row bar B' in the longitudinal direction "x", in addition to both ends of magnetic field applying row bar B'.

First magnetic field applying element 71 has the same structure as write head portion 2 of thin film magnetic head 9. Consequently, the magnetic pole layer has main magnetic pole layer 21' and auxiliary magnetic pole layer 22', and main magnetic pole layer 21' is exposed on air bearing surface ABS substantially perpendicularly thereto, although detailed explanation is omitted. Coil layer 23', which extends above gap layer 24' made of an insulating material, is wound around main magnetic pole layer 21' in order to induce a magnetic flux within main magnetic pole layer 21'. In order to concentrate a magnetic field onto magnetic field sensor 7 having a significantly small width, such as several tens of nanometers, in the track width direction thereof, first magnetic field applying element 71, similar to write head portion 2 of thin film magnetic head 9, has a limited width of several tens of nanometers in the track width direction, i.e., in the direction "x". In addition, in order to apply an intensive magnetic field onto magnetic field sensor 7 with regard to direction P that is perpendicular to the film plane, first magnetic field applying element 71 preferably has almost the same width in direction P as magnetic field sensor 7. This prevents a large magnetic field from being applied to upper and lower shield layers 3, 4. First magnetic field applying element 71 can apply an alternating magnetic field to magnetic field sensor 7 of thin film magnetic head 9 opposite thereto while varying the intensity of the magnetic field. The frequency of the alternating magnetic field can be determined as appropriate, according to the actual environment in a hard disk drive.

Second magnetic field applying element 72 applies a magnetic field to lapping guide L that is opposite thereto. Second magnetic field applying element 72 has the same structure as write head portion 2 of thin film magnetic head 9. Consequently, the magnetic pole layer has main magnetic pole layer 21" and auxiliary magnetic pole layer 22", and main magnetic pole layer 21" is exposed on air bearing surface ABS substantially perpendicularly thereto, although detailed explanation is omitted. Coil layer 23", which extends above gap layer 24" made of an insulating material, is wound around main magnetic pole layer 21" in order to induce a magnetic flux within main magnetic pole layer 21". In order to effectively apply a magnetic field to lapping guide L having a width of several micrometers in the longitudinal direction "x", the width in the longitudinal direction "x" is preferably several micrometers, similar to lapping guide L.

In the present embodiment, first and second magnetic field applying elements 71, 72 are provided with write magnetic pole layers for the so-called perpendicular magnetic recording type. However, needless to say, the elements may alternatively have a magnetic pole structure for the horizontal magnetic recording type.

Figure 8A:
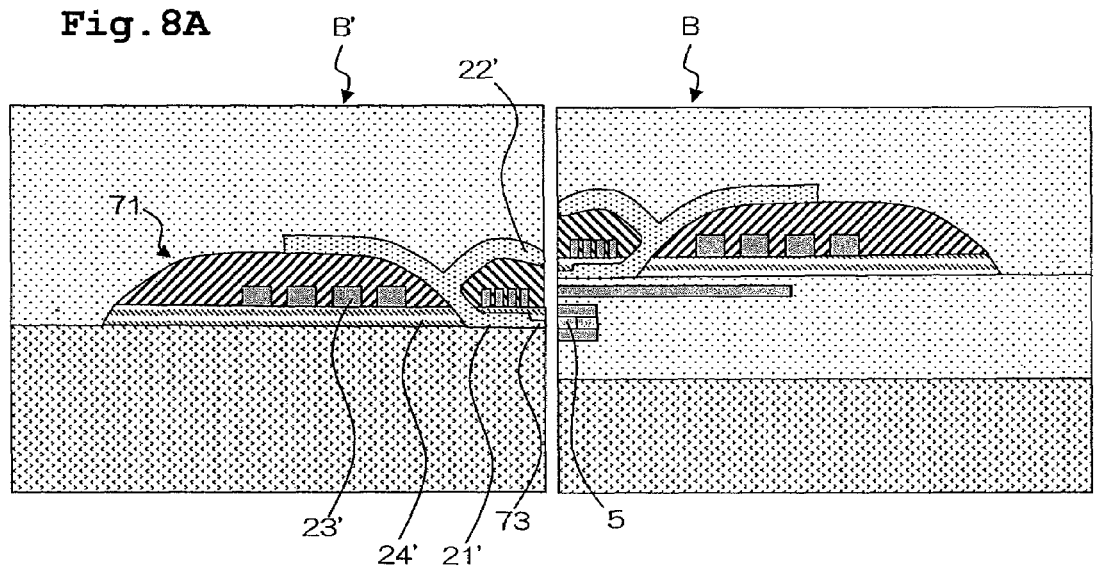
FIG. 8A is a cross-sectional view taken along line 8A-8A of FIG. 7, in which a first magnetic field applying element is disposed opposite to the magnetic field sensor of the corresponding thin film magnetic head.
Figure 8B:
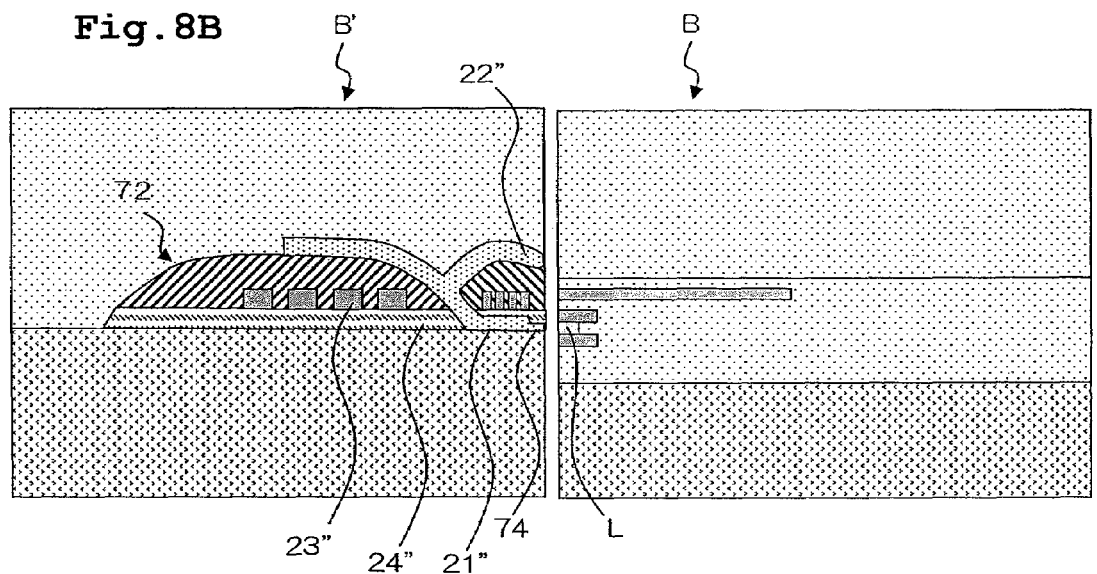
FIG. 8B is a cross-sectional view taken along line 8B-8B of FIG. 7, in which a second magnetic field applying element is disposed opposite to the corresponding lapping guide.

(Step S3) Next, magnetic field applying row bar B' is disposed opposite to row bar B such that magnetic pole end 73 of first magnetic field applying element 71 is opposite to magnetic field sensor 7 of corresponding thin film magnetic head 9 and such that magnetic pole end 74 of second magnetic field applying element 72 is opposite to corresponding lapping guide L (first positioning step). FIG. 8A is a cross-sectional view taken along line 8A-8A of FIG. 7, in which first magnetic field applying element 71 is disposed opposite to magnetic field sensor 7 of corresponding thin film magnetic head 9. FIG. 8B is a cross-sectional view taken along line 8B-8B of FIG. 7, in which second magnetic field applying element 72 is disposed opposite to corresponding lapping guide L. Magnetic field applying row bar B' is spaced apart from row bar B in these figures, but may be in contact with row bar B. Further, there may be a small gap between magnetic field applying row bar B' and row bar B, as illustrated in these figures, in order to protect the air bearing surface of row bar B.

In the following positioning steps S3, S4 and S5, the relative movement between magnetic field applying row bar B' and row bar B is adapted to occur as a rectilinear movement in the longitudinal direction "x", as a rectilinear movement in the direction "y" that is perpendicular to the film plane and as a rotational movement about direction "z" (z-axis), wherein the direction "z" is defined to be a direction that is both perpendicular to the longitudinal direction "x" of row bar B and perpendicular to the direction "y". Means for realizing such movements can be selected as needed. The means includes, for example, attaching row bar B to an appropriate fixing means and attaching magnetic field applying row bar B' to an x-y stage that is capable of moving according to the three degrees of freedom described above. The rotational movement about the direction "z" corrects the possible state in which row bar B and magnetic field applying row bar B' are mounted askew relative to each other. However, if sufficient accuracy in mounting is ensured and adjustment of rotational angles in the direction "z" is not necessary, then the adjustment can be made only by rectilinear movements in the directions "x" and "y".

The positioning in this step is made in order to roughly position magnetic field applying row bar B' relative to row bar B. Methods for the positioning include, for example, making the edges of row bar B' and the edges of row bar B correspond with each other by using mechanical or optical monitoring means. The accuracy in positioning is, so to speak, a mechanically achievable level, and may be insufficient. However, this step provides rough but simple positioning means and enables the second and third positioning steps, which will be described later, to be performed in a more efficient manner.

Figure 9A:
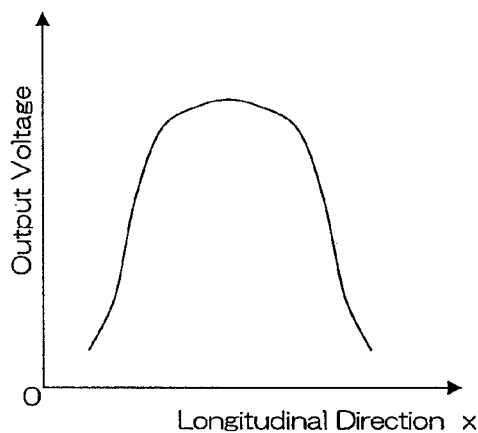
FIGS. 9A and 9B are conceptual views illustrating a change in the output voltage of a lapping guide when magnetic field applying row bar B' is moved in directions "x" and "y", respectively.
Figure 9B:
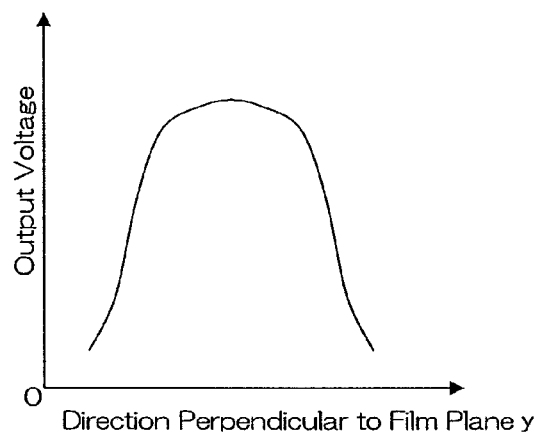

(Step S4) Next, after first positioning step S3, a magnetic field is applied to lapping guides L from second magnetic field applying elements 72 while an electrical current is applied to lapping guides L. Further, a relative movement between magnetic field applying row bar B' and row bar B is made so that at least one lapping guide L exhibits the largest output voltage (the second positioning step). By applying a magnetic field to lapping guide L, which has magnetic layers that exhibit the magnetoresistance effect as described above, a variation in the electrical resistance of a sense current occurs according to the intensity of the magnetic field, and thereby, a variation in the voltage between both ends 14a, 14b of lapping guide L is caused. FIG. 9A is a conceptual view illustrating a change in the output voltage of lapping guide L when magnetic field applying row bar B' is moved in the direction "x". When magnetic field applying row bar B' is moved in the direction "x" and second magnetic field applying element 72 comes to a position that is substantially opposite to lapping guide L with regards to the direction "x", lapping guide L is subjected to the largest magnetic field and thereby exhibits the largest output voltage. Similarly, FIG. 9B is a conceptual view illustrating a change in the output voltage of lapping guide L when magnetic field applying row bar B' is moved in the direction "y". When magnetic field applying row bar B' is moved in the direction "y" and second magnetic field applying element 72 comes to a position that is substantially opposite to lapping guide L with regards to the direction "y", lapping guide L is subjected to the largest magnetic field and thereby exhibits the largest output voltage. The adjustment in the direction "x" may precede the adjustment in the direction "y", and vice versa. When the adjustments for both directions are made so that lapping guide L exhibits the largest output voltage, second magnetic field applying element 72 comes to a position that is substantially opposite to lapping guide L.

On completion of these processes, second magnetic field applying element 72 comes to a position that is substantially opposite to lapping guide L in a region in which lapping guide L has been subjected to the positioning adjustment. However, there is actually the possibility in which magnetic field applying row bar B' and row bar B are disposed askew relative to each other. Hence, after a positioning adjustment is completed based on one lapping guide L, another positioning adjustment is preferably performed based on another lapping guide L. By rotating magnetic field applying row bar B' about the position of lapping guide L that has already been adjusted, the orientation (the rotational angle) of magnetic field applying row bar B' can be adjusted so that magnetic field applying row bar B' and row bar B become parallel with each other. Needless to say, it is also possible to perform positioning adjustment based on the linear movements in the directions "x" and "y", as well as the rotational movement about the z-axis, while simultaneously monitoring the output voltages of more than one lapping guide L.

This step makes it possible to perform the positioning of magnetic field applying row bar B' and row bar B with more accuracy than in first positioning step S3. It should be noted that the accuracy obtained in this step depends on the width and the magnetoresistance ratio of lapping guide L. However, if the positioning adjustment is performed with sufficient accuracy in this step, then it is possible to omit third positioning step S5 that follows and to go to measurement step S6.

(Step S5) Next, a magnetic field is applied from first magnetic field applying element 71 to magnetic field sensor 7 of thin film magnetic head 9 while an electric current is applied to magnetic field sensor 7. Then, a relative movement between magnetic field applying row bar B' and row bar B is made so that magnetic field sensor 7 exhibits the largest output voltage (third positioning step). The process in this step is similar to second positioning step S4, but differs from step S4 in that the output voltage of magnetic field sensor 7 is used in place of the output voltage of lapping guide L. Specifically, when magnetic field applying row bar B' is moved in the direction "x" and first magnetic field applying element 71 comes to a position that is substantially opposite to the magnetic field sensor with regards to the direction "x", magnetic field sensor 7 is subjected to the largest magnetic field and also exhibits the largest output voltage. Further, when magnetic field applying row bar B' is moved in the direction "y" and first magnetic field applying element 71 comes to a position that is substantially opposite to the magnetic field sensor with regards to the direction "y", magnetic field sensor 7 is subjected to the largest magnetic field and also exhibits the largest output voltage. The adjustment in the direction "x" may precede the adjustment in the direction "y", and vice versa. When the adjustments for both directions are completed so that magnetic field sensor 7 exhibits the largest output voltage, first magnetic field applying element 71 comes to a position that is substantially opposite to magnetic field sensor 7.

Figure 10A:
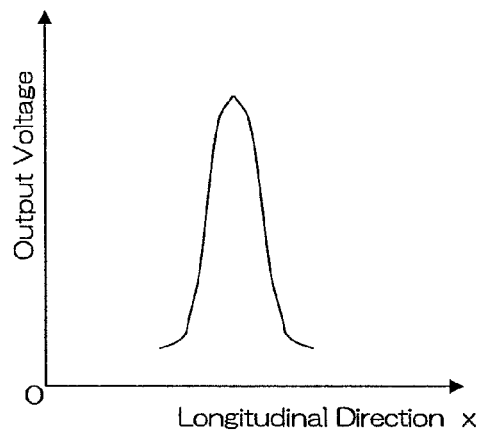
FIGS. 10A and 10B are conceptual views illustrating a change in the output voltage of a magnetic field sensor when magnetic field applying row bar B' is moved in directions "x" and "y", respectively.
Figure 10B:
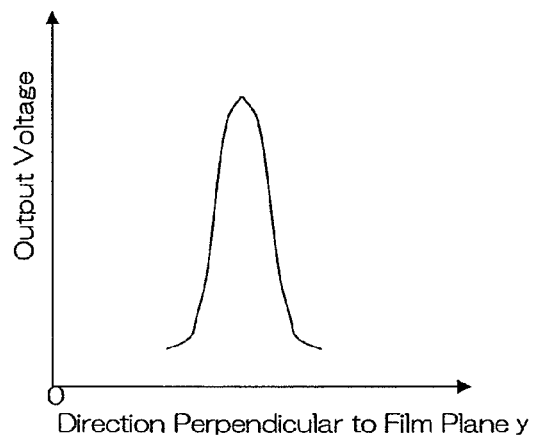

FIG. 10A is a conceptual view illustrating a change in the output voltage of magnetic field sensor 7 when magnetic field applying row bar B' is moved in the direction "x". Similarly, FIG. 10B is a conceptual view illustrating a change in the output voltage of magnetic field sensor 7 when magnetic field applying row bar B' is moved in the direction "y". As will be apparent from the comparison between these figures and FIGS. 9A and 9B, the output relative to the movement in the direction "x" or "y" exhibits a more sensitive change. This is because magnetic field sensor 7 has a significantly smaller width in the track width direction than lapping guide L. As described above, magnetic field sensor 7 has a track width direction in the order of several tens of nanometers, whereas lapping guide L has a track width direction in the order of several micrometers. Thus, there is a difference in the width by a factor of hundreds. Consequently, step S5 makes it possible to adjust first magnetic field applying element 71 to a position that is almost completely opposite to magnetic field sensor 7.

It should be noted that all of first magnetic field applying elements 71 do not have to be monitored, although magnetic field applying elements 71 are provided in as many numbers as sliders S so that each magnetic field applying element 71 corresponds to each magnetic field sensor 7. The adjustment can be suitably performed only by using first magnetic field applying elements 71 near both ends of magnetic field applying row bar B' and magnetic field sensors 7 near both ends of row bar B. Magnetic field sensor 7 in each slider S is formed in sufficiently accurate dimensions and in a sufficiently accurate array pitch in the wafer process. First magnetic field applying element 71 in magnetic field applying row bar B' is also formed in sufficiently accurate dimensions and in a sufficiently accurate array pitch in the wafer process. Accordingly, as a result of using first magnetic field applying elements 71 near both ends of magnetic field applying row bar B' in order to adjust the position of magnetic field applying row bar B', the other first magnetic field applying elements 71 are automatically placed in positions that are opposite to respective magnetic field sensors 7.

Figure 11:
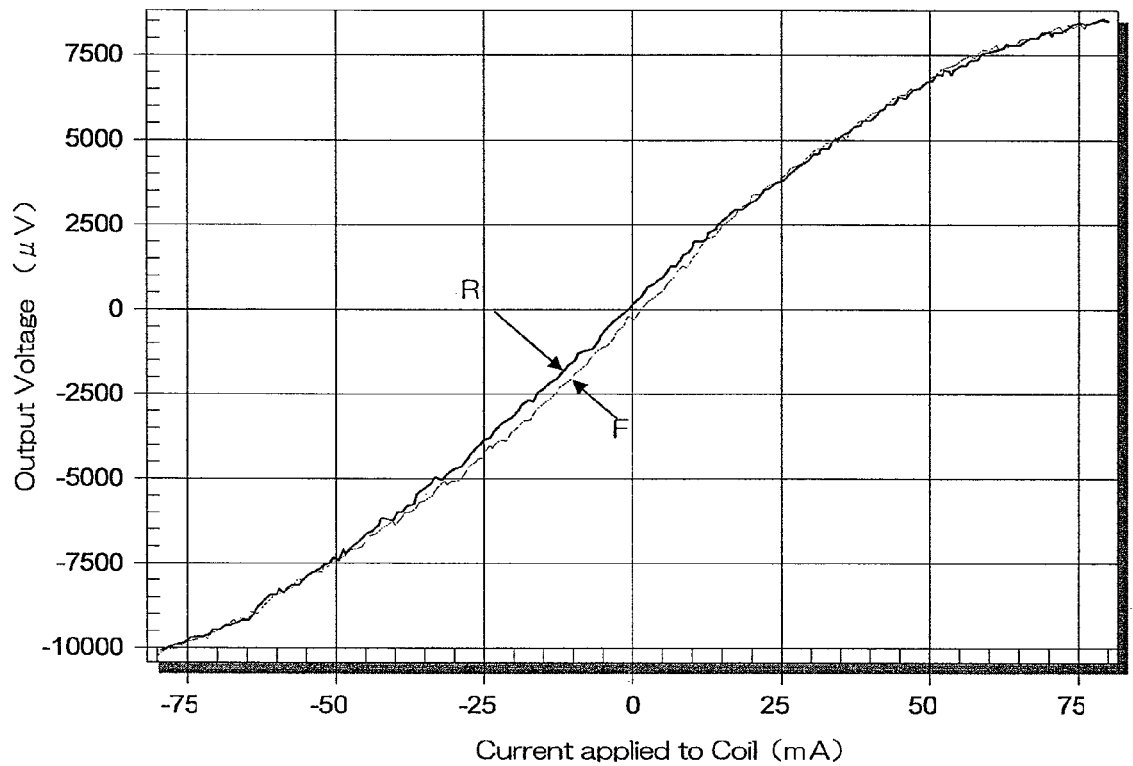
FIG. 11 is a graphical view illustrating the relationship between the intensity of a magnetic field and the output voltage of a magnetic field sensor that is obtained by the method for inspecting the magnetic characteristics of a thin film magnetic head in accordance with an embodiment of the present invention.

(Step S6) After the third positioning step, an alternating magnetic field is applied, from first magnetic field applying elements 71 to magnetic field sensors 7 of thin film magnetic heads 9, while an electric current is applied to magnetic field sensors 7, and while the intensity of the magnetic field is changed, and therefore the relationship between the intensity of the magnetic field and the output voltage of the magnetic field sensor is obtained (measurement step). The output voltage obtained by magnetic field sensors 7 is measured by pads 11a, 11b on slider S through probes or the like. As a result, a measurement result, such as the one shown in FIG. 11, is obtained for each slider S. The figure shows an example of the output voltage when an alternating magnetic field having a frequency of 1 megahertz is applied. The line shown by symbol F in the figure denotes the output versus a magnetic field with increasing intensity, while the line shown by symbol R denotes the output versus a magnetic field with decreasing intensity. The step is basically the same as in the conventional QST. However, this step differs from the conventional QST in that a plurality of first magnetic field applying elements 71 is provided such that each first magnetic field applying element corresponds to each slider S and in that individual first magnetic field applying element 71 applies a magnetic field to corresponding magnetic field sensor 7.

According to the present embodiment, first magnetic field applying element 71 has substantially the same structure as a conventional write element and is capable of generating an alternating magnetic field of several megahertz without difficulty. This makes it possible to create a test environment that well simulates the actual condition in a hard disk drive as regards generation of a magnetic field, and thereby improves reliability of the test.

In addition, when the present embodiment is applied to the above-described thin film magnetic head, the following specific effects can be expected. Specifically, the above-described thin film magnetic head has upper and lower shield electrode layers which are magnetized in directions that are anti-parallel to each other and has a pair of magnetic layers which are exchange-coupled with the shield electrode layers. While this state is maintained, the pair of magnetic layers is magnetized by a bias magnetic field so that the magnetization directions thereof are perpendicular to each other, and the pair of magnetic layers is further magnetized so that the angle between the magnetization directions of the pair of magnetic layers is changed by the effect of an external magnetic field. In such a thin film magnetic head, the upper and lower shield electrode layers not only serve as magnetic shields but also directly affect the magnetization state of the pair of magnetic layers, and accordingly, the state of the shield electrode layers in which the magnetization directions are anti-parallel with each other should be maintained even during a test. The intensity of a magnetic field applied in the QST is significantly larger than that in the actual environment within a hard disk drive. Thus, the magnetization of the upper and lower shield electrode layers may be disturbed by a magnetic field that is applied during the test, and the characteristics of a magnetoresistance effect element may be greatly affected. This may make an appropriate test impossible. In the present embodiment, the first magnetic field applying element locally exerts a magnetic field on a corresponding magnetic field sensor, and the upper and lower shield electrode layers are subjected to a magnetic field that is significantly smaller than that applied in the QST. Consequently, the above-described problems can be easily solved.

The method for inspecting the magnetic characteristics using a magnetic field applying bar has such advantages as described above. However, it is necessary for each first magnetic field applying element to be precisely arranged opposite to the corresponding magnetic field sensor. It should be noted that this is a problem that is specific to the method for inspecting magnetic characteristics using a magnetic field applying bar and that this is also a problem that occurs only if the method for inspecting magnetic characteristics using a magnetic field applying bar, which is novel per se, has been invented. However, this problem can also be solved effectively by magnetic positioning that uses a lapping guide as a positioning sensor and, if necessary, by magnetic positioning that uses a magnetic field sensor as a positioning sensor. The lapping guide is commonly introduced in the manufacturing process of conventional thin film magnetic heads in order to monitor the lapping amount of the elements. Generally speaking, this does not mean that any additional elements are required in the wafer process. It should be noted that the present embodiment can be basically carried out simply by replacing a conventional Helmholtz coil with a magnetic field applying bar.

Although certain preferred embodiments of the present invention have been shown and described in detail, it should be understood that various changes and modifications may be made without departing from the spirit or scope of the appended claims.

What is claimed is:

1. A method for inspecting magnetic characteristics of a thin film magnetic head that is arranged in a row bar, comprising:
   a step of preparing a row bar having a plurality of sliders which are arranged along a longitudinal direction of said row bar, each slider including a thin film magnetic head formed therein, wherein said row bar is provided with lapping guides having magnetoresistance effect, said lapping guides being located at at least two positions which are selected from positions between the sliders adjacent to each other and positions at both ends of said row bar;
   a step of preparing a magnetic field applying row bar having first magnetic field applying elements, each of which corresponds to each thin film magnetic head, and having at least two second magnetic field applying elements, each of which corresponds to each of the at least two lapping guides;
   a first positioning step in which said magnetic field applying row bar is arranged opposite to said row bar such that a magnetic pole end of each first magnetic field applying element faces a magnetic field sensor of the corresponding thin film magnetic head and such that a magnetic pole end of each second magnetic field applying element faces the corresponding lapping guide;
   a second positioning step in which a magnetic field is applied from said second magnetic field applying elements to said lapping guides while an electric current is applied to said lapping guide, and in which a relative movement between said magnetic field applying row bar and said row bar is made so that at least one of said lapping guides exhibits a largest output voltage, said second positioning step being carried out after said first positioning step; and
   a measurement step in which an alternating magnetic field is applied, from said first magnetic field applying element to said magnetic field sensor of said thin film magnetic head, while an electric current is applied to said magnetic field sensor, and while intensity of the magnetic field is changed, and in which a relationship between the intensity of the magnetic field and an output voltage of the magnetic field sensor is obtained, said measurement step being carried out after said second positioning step.

2. The method according to claim 1, further comprising a third positioning step in which a magnetic field is applied from said first magnetic field applying element to said magnetic field sensor of said thin film magnetic head, while an electric current is applied to said magnetic field sensor, and in which a relative movement between said magnetic field applying row bar and said row bar is made so that said magnetic field sensor exhibits a largest output voltage, said third positioning step being carried out after said second positioning step and prior to said measurement step.

3. The method according to claim 1, wherein the relative movement of said magnetic field applying row bar and said row bar is made in a form of a rectilinear movement in direction "x", in a form of a rectilinear movement in direction "y", or in a form of a rotational movement about direction "z", or in a form of a combination thereof, wherein said direction "x" is defined to be the longitudinal direction of said row bar, said direction "y" is defined to be a direction tat is perpendicular to a film plane of said magnetic field applying row bar, and said direction "z" is defined to be a direction that is perpendicular both to the direction "x" and to the direction "y".

4. The method according to claim 1, wherein said thin film magnetic head is provided with a pair of magnetic layers whose magnetization directions change according to an external magnetic field, the pair of magnetic layers serving as said magnetic field sensor, wherein said thin film magnetic head is further provided with a pair of shield layers which sandwich said pair of magnetic layers in a stacking direction thereof, said pair of shield layers being magnetized in track width directions that are anti-parallel to each other, and wherein each of said pair of magnetic layers is exchange-coupled with the shield layer that is adjacent thereto.

5. A method for manufacturing a thin film magnetic head, including the method according to claim 1.

6. A magnetic field applying row bar that is used to inspect magnetic characteristics of a thin film magnetic head that is arranged in a row bar, wherein said row bar has a plurality of sliders which are arranged along a longitudinal direction of said row bar, each slider including a thin film magnetic head formed therein, wherein said row bar is provided with lapping guides having magnetoresistance effect, said lapping guides being located at at least two positions which are selected from positions between the sliders adjacent to each other and positions at both ends of said row bar, comprising:
   a plurality of first magnetic field applying elements that are located such that a magnetic pole end of each first magnetic field applying element faces a magnetic field sensor of said thin film magnetic head when said magnetic field applying row bar is arranged opposite to said row bar; and at least two second magnetic field applying elements that are located such that magnetic pole ends thereof face at least two of said lapping guides when said magnetic field applying row bar is arranged opposite to said row bar;

wherein said first magnetic field applying element is capable of applying an alternating magnetic field to said magnetic field sensor that is opposite thereto while varying intensity of the magnetic field, and said second magnetic field applying element is configured to apply magnetic field to said lapping guide that is opposite thereto.

* * * * *